(12) United States Patent
Hanabe et al.

(10) Patent No.: US 6,444,135 B1
(45) Date of Patent: Sep. 3, 2002

(54) METHOD TO MAKE GAS PERMEABLE SHELL FOR MEMS DEVICES WITH CONTROLLED POROSITY

(75) Inventors: Murali Hanabe; Risaku Toda, both of Plano, TX (US)

(73) Assignee: Ball Semiconductor, Inc., Allen, TX (US)

( * ) Notice: Subject to any disclaimer, the term of this patent is extended or adjusted under 35 U.S.C. 154(b) by 150 days.

(21) Appl. No.: 09/688,722

(22) Filed: Oct. 16, 2000

Related U.S. Application Data

(63) Continuation-in-part of application No. 09/483,640, filed on Jan. 14, 2000, now Pat. No. 6,197,610.

(51) Int. Cl.⁷ .............................. B31D 3/00; B01D 63/00
(52) U.S. Cl. ..................... 216/56; 216/41; 210/321.84
(58) Field of Search ................. 216/41, 56; 210/321.84

(56) References Cited

U.S. PATENT DOCUMENTS

| | | | |
|---|---|---|---|
| 3,611,345 A | 10/1971 | Pintell | 340/280 |
| 3,701,093 A | 10/1972 | Pick | 340/52 |
| RE31,473 E | 12/1983 | Kilby et al. | 425/6 |
| 4,493,155 A | 1/1985 | Comeau et al. | 33/366 |
| 5,010,893 A | 4/1991 | Sholder | 128/782 |
| 5,168,138 A | 12/1992 | Evans | 200/61.52 |
| 5,450,676 A | 9/1995 | Thornsberry | 33/366 |
| 5,462,639 A | 10/1995 | Matthews et al. | 156/662.1 |
| 5,567,551 A | * 10/1996 | Yahalom et al. | 216/12 |
| 5,602,429 A | 2/1997 | Scgiebelhuth | 307/121 |
| 5,726,480 A | 3/1998 | Pister | 257/415 |
| 5,774,055 A | 6/1998 | Pomerantz | 340/573 |
| 5,808,254 A | 9/1998 | Wu | 200/61.45 |
| 5,919,364 A | * 7/1999 | Lebouitz et al. | 210/321.84 |
| 6,148,699 A | 11/2000 | Roest | 73/514.31 |
| 6,198,369 B1 | 3/2001 | Frank | 340/573.1 |

FOREIGN PATENT DOCUMENTS

JP    02-119241    10/1988    .......... H01L/21/82

* cited by examiner

*Primary Examiner*—Randy Gulakowski
*Assistant Examiner*—Shamim Ahmed
(74) *Attorney, Agent, or Firm*—Haynes and Boone, LLP

(57) ABSTRACT

A method and system for making a gas permeable shell in a micro electromechanical systems (MEMS) device is disclosed. The MEMS device is created with an internal sacrificial layer. The device is then coated with a slurry composition which, after drying, is later exposed to a solvent. As a result, the sacrificial layer is removed to produce interconnected voids.

10 Claims, 3 Drawing Sheets

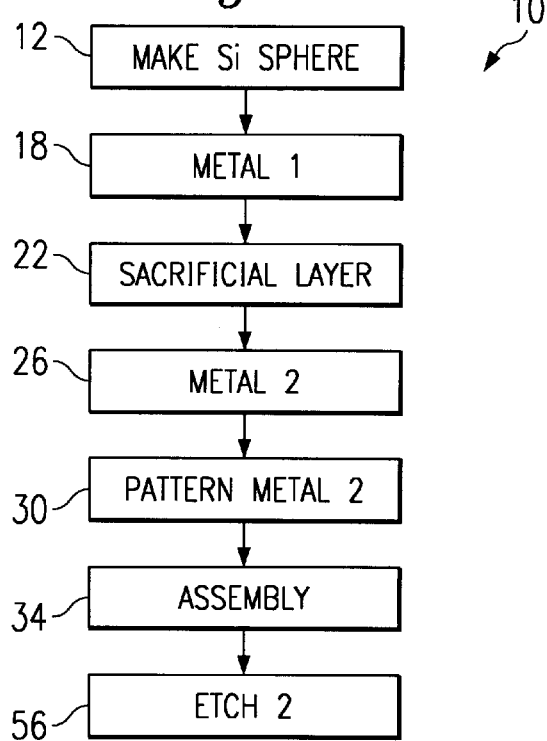
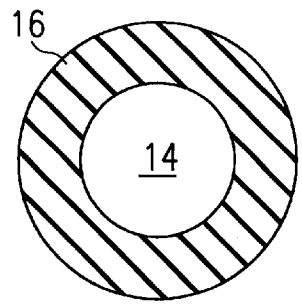
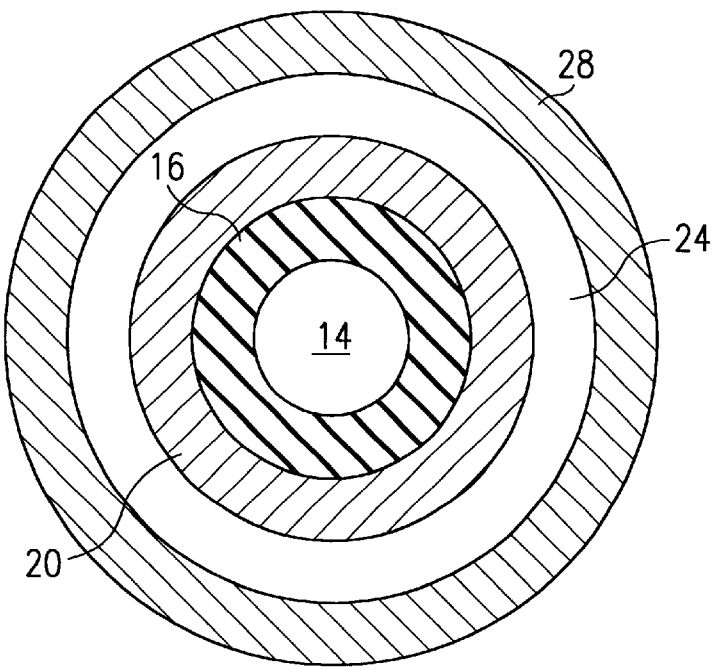

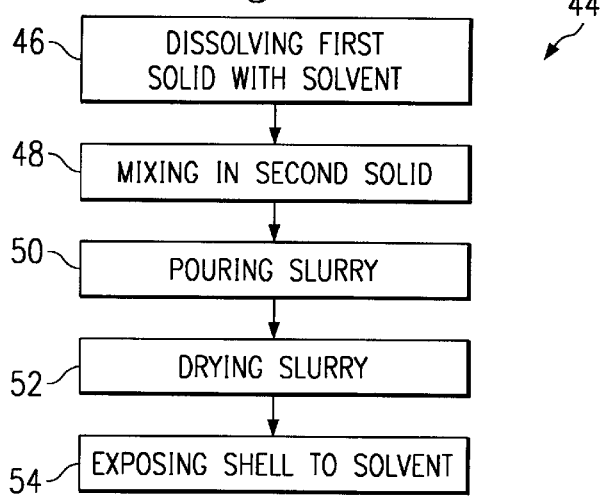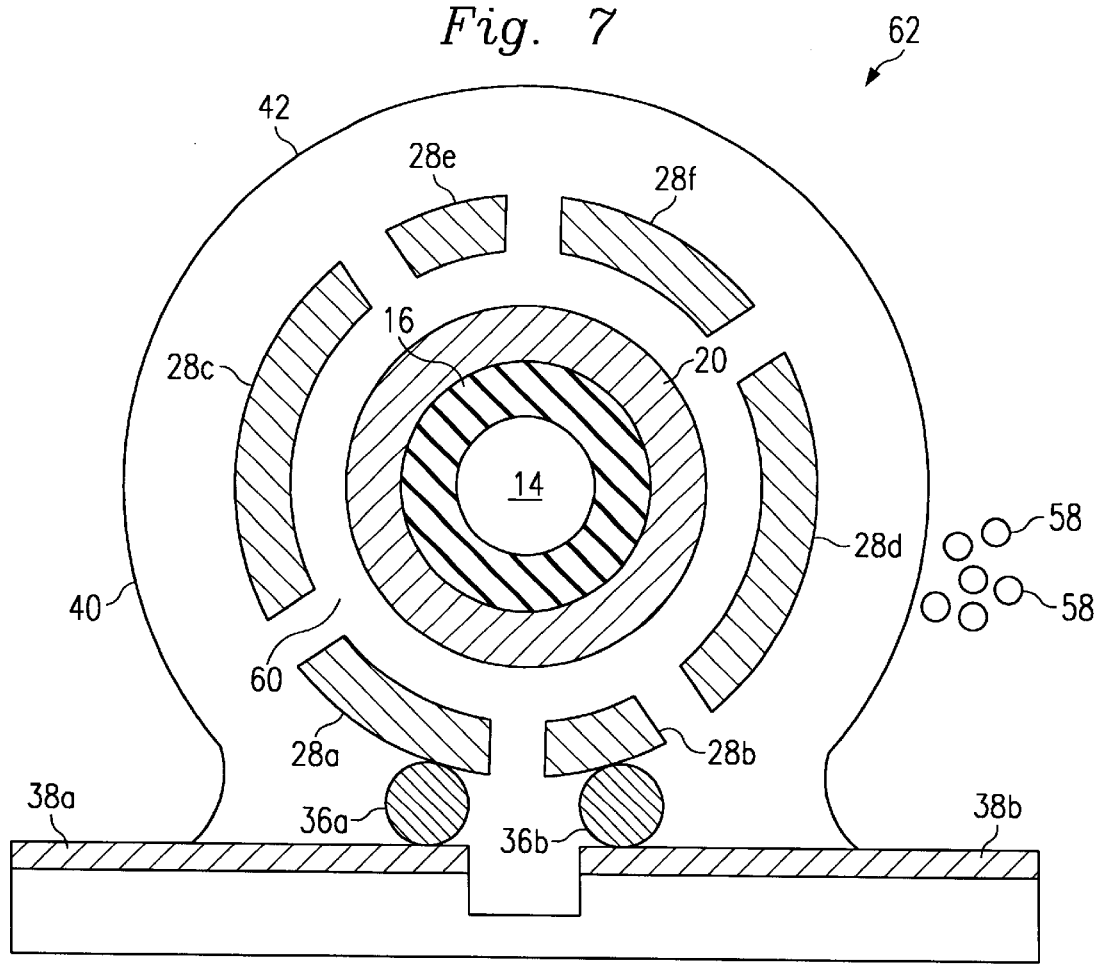

METHOD TO MAKE GAS PERMEABLE SHELL FOR MEMS DEVICES WITH CONTROLLED POROSITY

CROSS-REFERENCE

This application is a continuation-in-part of U.S. application Ser. No. 09/483,640, filed Jan. 14, 2000, and issued on Mar. 6, 2001, as U.S. Pat. No. 6,197,610.

BACKGROUND OF THE INVENTION

The invention relates generally to semiconductor processing, and in one embodiment, to a method for making a gas permeable shell for micro electro-mechanical systems (MEMS) devices, or small electrical/mechanical devices.

Many different integrated circuit devices require one or more small gaps placed within the circuit. For example, MEMS devices and other small electrical/mechanical devices may incorporate a gap in the device to allow the device to respond to mechanical stimuli. One common MEMS device is a sensor, such as an accelerometer, for detecting external force, acceleration or the like by electrostatically or magnetically floating a portion of the device. The floating portion can then move responsive to the acceleration and the device can detect the movement accordingly.

In U.S. Ser. No. 09/451,299, U.S. Pat. No. 6,271,145 assigned to the same assignee as the present application and hereby incorporated by reference as if reproduced in its entirety, the device has a micro spherical body referred to as a core, and a surrounding portion referred to as a shell. Electrodes in the shell serve not only to levitate the core by generating an electric or magnetic field, but to detect movement of the core within the shell by measuring changes in capacitance and/or direct contact of the core to the shell.

Conventionally, the core and the shell are separately made and assembled. Therefore, no appropriate method for making a MEMS device where the core and shell are precisely arranged in close vicinity with each other has been known.

SUMMARY OF THE INVENTION

The present invention provides a method for making small gaps in MEMS devices surrounded by gas permeable shells. In one embodiment, the MEMS device is first made with a sacrificial layer where the gap is to reside. The device can then be assembled, including forming a gas permeable shell surrounding the device. Pores in the gas permeable shell expose the sacrificial layer to an external environment. Through the small pores in the gas permeable shell, an etchant can then be applied through the pores to remove the sacrificial layer.

In some embodiments, the pores are formed using a solvent.

In some embodiments, the etchant is a dry etchant that can flow easily through the holes.

In some embodiments, one or more solder bumps are assembled to the device and a substrate before the sacrificial layer is removed.

In some embodiments, the gas permeable shell is also formed around the solder bumps and around the substrate.

In some embodiments, the device is built around a spherical shaped substrate. The device can also be built around a flat substrate.

BRIEF DESCRIPTION OF THE DRAWINGS

FIG. 1 is a flowchart of a manufacturing process for implementing one embodiment of the present invention.

FIGS. 2–5 are cross sectional views of a spherical shaped accelerometer being manufactured by the process of FIG. 1.

FIG. 6 is a flowchart of a manufacturing process for implementing one embodiment of the present invention of FIG. 1.

FIG. 7 is a cross sectional views of a spherical shaped accelerometer being manufactured by the processes of FIGS. 1 and 6.

DESCRIPTION OF THE EMBODIMENTS

Figure 4:
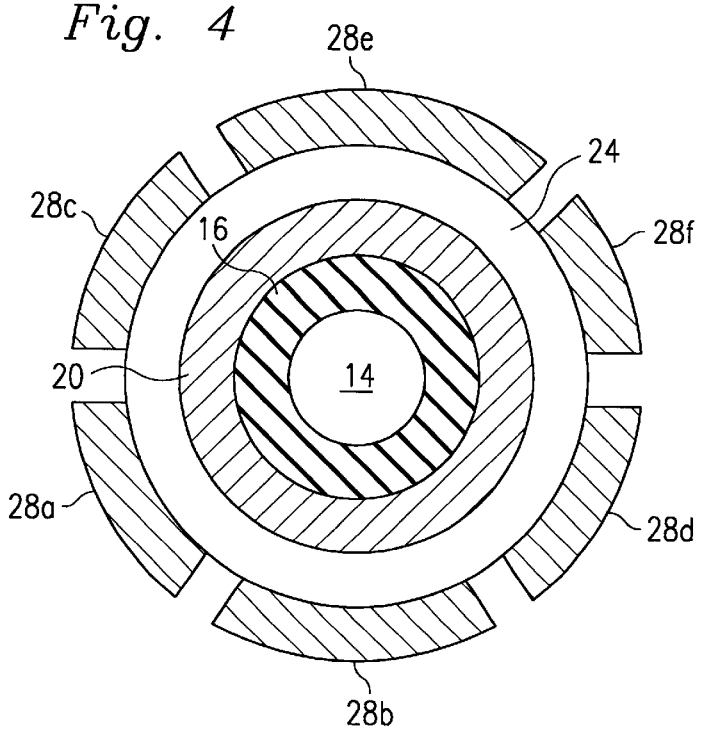

Referring to FIG. 1, the reference numeral 10 refers, in general, to a manufacturing process for making MEMS devices. It is understood that the present disclosure provides many different embodiments, or examples, for implementing different features. Techniques and requirements that are only specific to certain embodiments or certain shaped devices should not be imported into other embodiments or devices. Also, specific examples of process steps, materials, and components are described below to clarify the present disclosure. These are, of course, merely examples and are not intended to limit the invention from that described in the claims.

For the sake of example, FIGS. 2–5 illustrate a spherical shaped accelerometer that is being made by the manufacturing process 10. It is understood, however, that other MEMS devices can benefit from the process. For example, clinometers, ink-jet printer cartridges, and gyroscopes may be realized by utilizing a similar design. Many of the process steps discussed below where first suggested in U.S. Pat. No. 5,955,776, which is commonly assigned and hereby incorporated by reference.

At step 12 of the manufacturing process 10, a substrate is created. The substrate may be flat, spherical or any other shape. Referring also to FIG. 2, for the sake of example, a spherical substrate (hereinafter "sphere") 14 will be discussed. The sphere 14 is one that may be produced according to U.S. Ser. No. 09/363,420, which is hereby incorporated by reference, and to continue with the present example, is made of silicon crystal. On an outer surface 16 of the sphere 14 is a silicon dioxide (SiO2) layer. It is understood that the presence of the SiO2 layer 16 is a design choice and may not be used in certain embodiments.

At step 18 of FIG. 1, a first group of processing operations are performed on the substrate. This first group of processing operations represents any operations that may occur before a sacrificial layer is applied (described below, with respect to step 22). Referring also to FIG. 3, in continuance with the example, a first metal layer 20 (hereinafter "metal 1") is deposited on top of the SiO2 layer 16. The metal 1 layer 20 may be a copper-titanium nitride (Cu/TiN) material, although other materials may be used. This metal deposition may be created by several different methods, such as is described in U.S. pat. Ser. No. 09/069,654 U.S. Pat. Ser. No. 6,015,658 assigned to the same assignee as the present application and hereby incorporated by reference as if reproduced in its entirety.

At step 22 of FIG. 1, a sacrificial layer is applied to the substrate. The sacrificial layer may be applied on top of the previous layers (if any). In continuance with the example of FIG. 3, a sacrificial polysilicon layer 24 is applied on top of the metal 1 layer 20. The sacrificial layer 24 may be applied in any conventional manner, such as is described in the presently incorporated patents. Polysilicon is chosen because it reacts well with an etchant discussed below with respect to step 56, but it is understood that other materials can also be used.

At step 26 of FIG. 1, a second group of processing operations is performed on the substrate. This second group of processing operations represents any operations that may occur after the sacrificial layer is applied. In continuance with the example of FIG. 3, a second metal layer 28 (hereinafter "metal 2") is deposited on top of the sacrificial layer 24. The metal 2 layer 28 may also be Cu/TiN, although other materials may be used and the metal 2 layer may have a different composition than the metal 1 layer 20.

At step 30 of FIG. 1, one or more layers of material applied in the second group of processing operations are patterned. The patterning occurs before the removal of the sacrificial layer (described below, with respect to step 56). Referring also to FIG. 4, the metal 2 layer 28 is patterned to produce a plurality of electrodes 28a, 28b, 28c, 28d, 28e, and 28f.

The metal 2 layer 28 can be patterned by several different methods. For example, a resist coating may be applied to the metal 2 layer 28, such as is shown in U.S. pat. Ser. No. 09/351,202 and/or U.S. Pat. Ser. No. 60/137,014 which are both assigned to the same assignee as the present application and hereby incorporated by reference as if reproduced in their entirety.

Once the resist coating has been applied, the coating may be exposed using a conventional photolithography process. In the present embodiment, the etching should not remove the sacrificial layer 24. For example, photolithography processes, such as shown in U.S. pat. Ser. No. 09/350,815 U.S. Pat. No. 6,061,118 and/or U.S. pat. Ser. No. 09/348,369 which are both assigned to the same assignee as the present application and hereby incorporated by reference as if reproduced in their entirety, may be used. In the present example, the metal 2 layer 28 is the only layer that is patterned. For this reason, there is no need for alignment. It is understood, however, that different embodiments may indeed require alignment. For example, if the sphere 14 is flat, or if the metal 1 layer 20 is also patterned, the metal 2 layer 28 may indeed need to be patterned. Also, if the entire resist coating cannot be exposed at the same time, alignment between exposures may be required.

Once the resist coating has been fully exposed (to the extent required), the exposed surface can be developed and etched according to conventional techniques. For example, the exposed photo resist and Cu/TiN metal 2 layer may be etched according to a technique such as shown in U.S. pat. Ser. No. 09/350,045 U.S. pat. No. 6,007,388 assigned to the same assignee as the present application and hereby incorporated by reference as if reproduced in its entirety. Once etching is complete (and cleaning, if required), the electrodes 28a, 28b, 28c, 28d, 28e and 28f may be fully processed.

Figure 5:
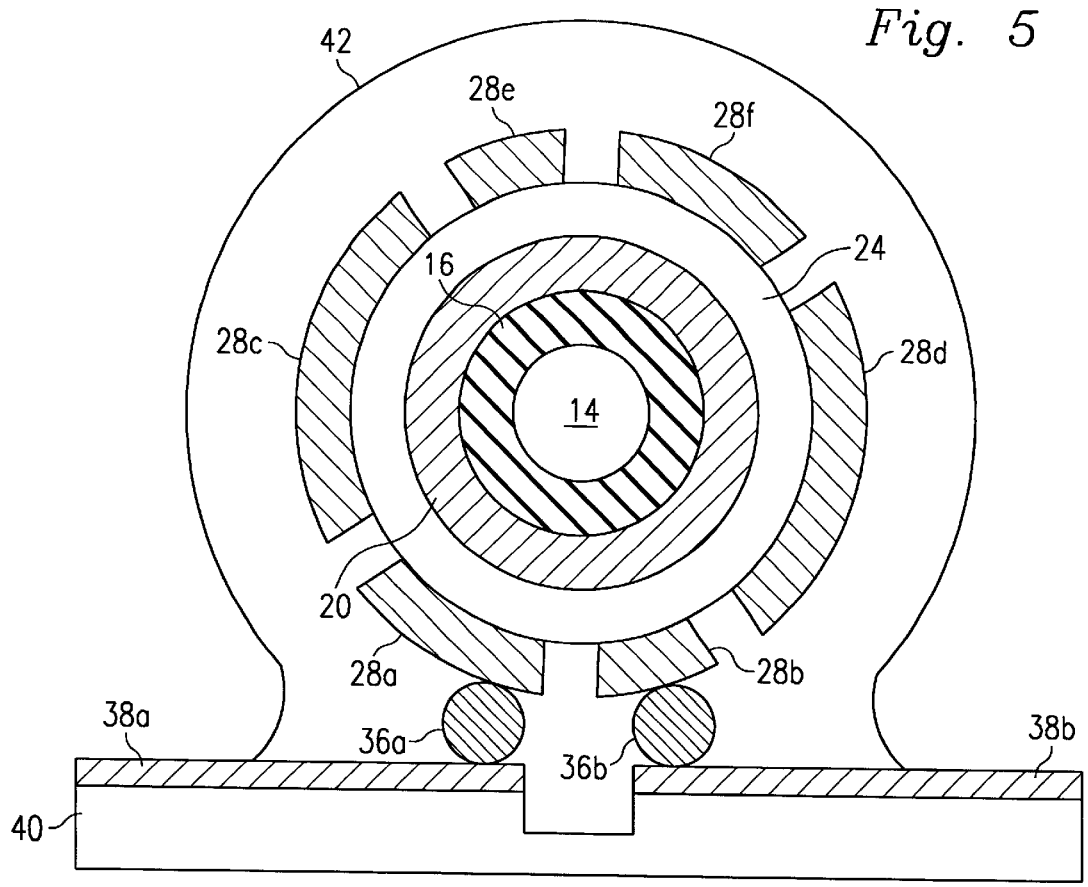

At step 34 of FIG. 1, the substrate and processed layers are assembled, as required by a particular application. Referring also to FIG. 5, a plurality of solder bumps 36a, 36b are applied to the electrodes 28a, 28b, respectively. The solder bumps 36a, 36b may also be applied to a plurality of electrodes 38a, 38b, respectively of a second substrate 40. Because the sacrificial layer 24 still exists, the process of applying the solder bumps 36a, 36b to the electrodes 28a, 28b and 38a, 38b is relatively straight forward. For the sake of example, the solder bump application may be performed by the method described in U.S. pat. Ser. No. 09/350,041 U.S. pat. No. 6,251,765 assigned to the same assignee as the present application and hereby incorporated by reference as if reproduced in its entirety.

Once the solder bumps have been applied and attached, a gas permeable shell 42 may be applied. In the present example of FIG. 5, the gas permeable shell 42 covers all of the electrodes 28a, 28b, 28c, 28d, 28e, 28f (and thus the underlying layers and substrates), the solder bumps 36a, 36b, and at least a portion of the electrodes 38a, 38b.

Referring to FIG. 6, the reference numeral 44 refers, in general, to one embodiment of a manufacturing process for producing a gas permeable shell that surrounds MEMS devices. At step 46, a first solid is dissolved in a solvent to form a solution. The first solid may be boron oxide ($B_2O_3$) or any other material. The solvent may be iso-propyl (IPA) alcohol or any other solvent.

At step 48, the solution from step 46 is mixed with a second solid to form a slurry. The second solid may be alumina cement or any other material. By controlling the amount of mixing in step 48, the size of the pores of the gas permeable shell 42 can be controlled. The size of the pores of the gas permeable shell 42 can be also be controlled by the composition of the slurry.

At step 50, the slurry from step 48 is poured onto the substrate and processed layers. The slurry covers all of the electrodes 28a, 28b, 28c, 28d, 28e, and 28f (and thus the underlying layers and substrates), the solder bumps 36a, 36b, and at least a portion of the electrodes 38a, 38b.

At step 52, the slurry covered substrate and processed layers are dried at room temperature. The second solid will be well dispersed in the gas permeable shell 42.

At step 54, the substrate and processed layers are exposed to the solvent. The solvent re-dissolves the first solid leaving behind the gas permeable shell 42. The gas permeable shell 42 has pores that are now interconnected and extend between the electrodes 28a, 28b, 28c, 28d, 28e and 28f to the sacrificial layer 24.

The above-described manufacturing process 10 uses the processing operations discussed above in a new and unique sequence. It is recognized that the processing operations referenced above, or different operations that better suit particular needs and requirements, may be used.

Referring again to FIG. 1, at step 56, the sacrificial layer is removed. Referring also to FIG. 7, the sacrificial layer 24 is etched through the gas permeable shell 42. In continuance of the above examples where the sacrificial layer 24 is polysilicon, a xenon difluoride (XeF2) dry etchant 58 can be used. The XeF2 dry etchant 58 has extremely high selectivity to various materials, such as the polysilicon, but will not react with the metal 2 layer 28 or the gas permeable shell 42. It is understood that other etchants may be used.

As a result, the sacrificial layer 24 is removed and a gap 60 is formed in its place. The gap 60 separates the sphere 14, SiO2 layer 16, and metal 1 layer 20 (collectively the "core") from the metal 2 layer 28 (the "shell"). In the present embodiment, the gap 60 extends around the entire core to complete the construction of a three-axis accelerometer 62.

Thus, there has been described and illustrated herein, a method for making small gaps for micro electromechanical systems (MEMS) devices, or small electrical/mechanical devices and a method for making a gas permeable shell for micro electromechanical systems (MEMS) devices, or small electrical/mechanical devices. It should be clearly understood, however, that various modifications, changes and substitutions are intended in the foregoing disclosure and in some instances some features of the invention will be employed without a corresponding use of other features. For example, the manufacturing process 10 of FIG. 1 can also work on other shaped substrates, such as flat two dimensional chips. Also, instead of solder bumps, a standard leadframe or other conventional system can be used. In some embodiments that utilize the standard leadframe, the gas permeable shell 42 may not extend to the second substrate 40. Accordingly, it is appropriate that the appended claims be construed broadly and in a manner consistent with the scope of the invention.

What is claimed is:

1. A method for making a gas permeable shell around a small electro/mechanical device, the method comprising the steps of:

dissolving a first solid in a solvent to form a solution;

mixing the solution with a second solid to form a slurry;

coating the electro/mechanical device with the slurry to form a coated electro/mechanical device;

drying the coated electro/mechanical device; and exposing the coated electro/mechanical device to the solvent to re-dissolve the first solid.

2. The method of claim 1 wherein the step of exposing the coated electro/mechanical device to the solvent includes producing a plurality of interconnected voids.

3. The method of claim 2 further comprising controlling the size of the voids by the composition of the slurry.

4. The method of claim 2 wherein the mixing is performed in a predetermined manner to control size of the voids.

5. The method of claim 1 wherein the small electro/mechanical device is built around a spherical shaped substrate.

6. A method for making a gas permeable shell around a micro electro-mechanical systems (MEMS) device, comprising the steps of:

dissolving a first solid in a solvent to form a solution;

mixing the solution with a second solid to form a slurry;

coating the MEMS device with the slurry to form a coated MEMS device;

drying the coated MEMS device;

exposing the coated MEMS device to the solvent to re-dissolve the first solid.

7. The method of claim 6 wherein the step of exposing the coated MEMS device to the solvent, produces a plurality of interconnected voids.

8. The method of claim 7 wherein the size of the voids are controlled by the composition of the slurry.

9. The method of claim 7 wherein the size of the voids are controlled by the step of mixing the solution with the second solid.

10. The method of claim 6 wherein the MEMS device is an accelerometer.

* * * * *